United States Patent
Ando et al.

(10) Patent No.: US 10,444,584 B2
(45) Date of Patent: Oct. 15, 2019

(54) ARRAY SUBSTRATE AND LIQUID CRYSTAL DISPLAY DEVICE HAVING ARRAY SUBSTRATE

(71) Applicant: Mitsubishi Electric Corporation, Tokyo (JP)

(72) Inventors: Manami Ando, Tokyo (JP); Manabu Tanahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/034,160

(22) Filed: Jul. 12, 2018

(65) Prior Publication Data
US 2019/0033674 A1 Jan. 31, 2019

(30) Foreign Application Priority Data
Jul. 26, 2017 (JP) .................................. 2017-144069

(51) Int. Cl.
| G02F 1/1362 | (2006.01) |
| G02F 1/1368 | (2006.01) |
| G02F 1/1333 | (2006.01) |
| H01L 27/12 | (2006.01) |
| H01L 29/786 | (2006.01) |
| G02F 1/1343 | (2006.01) |
| G02F 1/1345 | (2006.01) |

(52) U.S. Cl.
CPC ...... *G02F 1/136286* (2013.01); *G02F 1/1368* (2013.01); *G02F 1/133345* (2013.01); *H01L 27/124* (2013.01); *H01L 27/1225* (2013.01); *H01L 29/7869* (2013.01); *G02F 1/1345* (2013.01); *G02F 1/134309* (2013.01); *G02F 2201/121* (2013.01); *G02F 2201/122* (2013.01); *G02F 2201/123* (2013.01)

(58) Field of Classification Search
CPC .......................... G02F 1/136286; H01L 27/124
See application file for complete search history.

(56) References Cited

U.S. PATENT DOCUMENTS

| 2010/0187532 A1 | 7/2010 | Nagano et al. |
| 2013/0113109 A1* | 5/2013 | Nagano ................. G02F 1/1345 257/773 |

FOREIGN PATENT DOCUMENTS

| JP | 2010-191410 A | 9/2010 |
| JP | 2015-114568 A | 6/2015 |

* cited by examiner

*Primary Examiner* — Moazzam Hossain
*Assistant Examiner* — Farun Lu
(74) *Attorney, Agent, or Firm* — Studebaker & Brackett PC

(57) ABSTRACT

Although each drain electrode extension portion which is a connection region between a drain electrode and a pixel electrode does not transmit visible light, making an end side of the drain electrode extension portion coincide with an end side of the pixel electrode can improve an aperture ratio. In addition, making each semiconductor layer with high resistance protrude from the end side of the drain electrode extension portion can restrict an increase in parasitic capacitance and bring the drain electrode extension portion closer to the gate wiring.

11 Claims, 7 Drawing Sheets

ARRAY SUBSTRATE AND LIQUID CRYSTAL DISPLAY DEVICE HAVING ARRAY SUBSTRATE

BACKGROUND OF THE INVENTION

Field of the Invention

The present invention relates to an array substrate forming a liquid crystal display device.

Description of the Background Art

The liquid crystal display device includes a pair of substrates arranged to face each other and a liquid crystal layer provided between the substrates. A pixel electrode corresponding to each pixel of the liquid crystal display device, a switching element such as a thin-film transistor which transmits a signal voltage to the pixel electrode, a wiring connected to the switching element, and the like are formed on one of the pair of substrates. This substrate is sometimes referred to as an array substrate or an active matrix substrate. The other substrate is sometimes referred to as a counter substrate.

Generally, each pixel electrode formed on an array substrate is formed of a transparent conductive film that transmits visible light, and indium tin oxide or indium zinc oxide is used as a material for the pixel electrode. On the other hand, a metal film is generally used as an electrical connecting member between the pixel electrode and the thin-film transistor. The metal film reflects visible light, and hence does not transmit visible light.

In recent years, a liquid crystal display device is required to have high definition image quality, and hence the size of each pixel electrode inevitably needs to be reduced. This also reduces the amount of transmitted light per pixel of the array substrate. Alternatively, a high-luminance liquid crystal display device is sometimes required. To that end, in order to secure the light amount necessary for display in any case, it is necessary to reduce the regions that do not transmit visible light such as the connecting member between each pixel electrode and each thin-film transistor as much as possible and to increase the light transmission region in each pixel electrode.

An example of such a region includes a wiring for transmitting a signal to an electrode of a thin-film transistor or a thin-film transistor. However, because there is a background that a metal film is used for an electrode and a wiring in order to reduce the electric resistance in the first place, narrowing these regions leads to an increase in electrical resistance and causes display defects.

For this reason, a measure to minimize the extent to which the connecting member reduces the light transmission area of each pixel electrode has been considered. Generally, in such connection, a structure is known in which a part of the drain electrode of each thin-film transistor is extended toward the pixel electrode and directly stacked on the pixel electrode. (Japanese Patent Application Laid-Open No. 2010-191410)

SUMMARY

It is an object of the present invention to improve the aperture ratio by optimizing the connection structure and disposition between each pixel electrode and each drain electrode in a liquid crystal display device.

An array substrate includes, on a substrate, a gate wiring, a source wiring orthogonal to the gate wiring via an insulating film, a source electrode connected to the source wiring, a semiconductor layer formed as a lower layer of the source electrode, a drain electrode facing the source electrode on the semiconductor layer and having an extension portion, and a pixel electrode directly stacked on the extension portion of the drain electrode. An end side of the extension portion of the drain electrode coincides with an end side of the pixel electrode.

It is possible to obtain a high-definition or high-luminance liquid crystal display device that can optimize the connection structure and disposition between each pixel electrode and each drain electrode and improve the aperture ratio.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
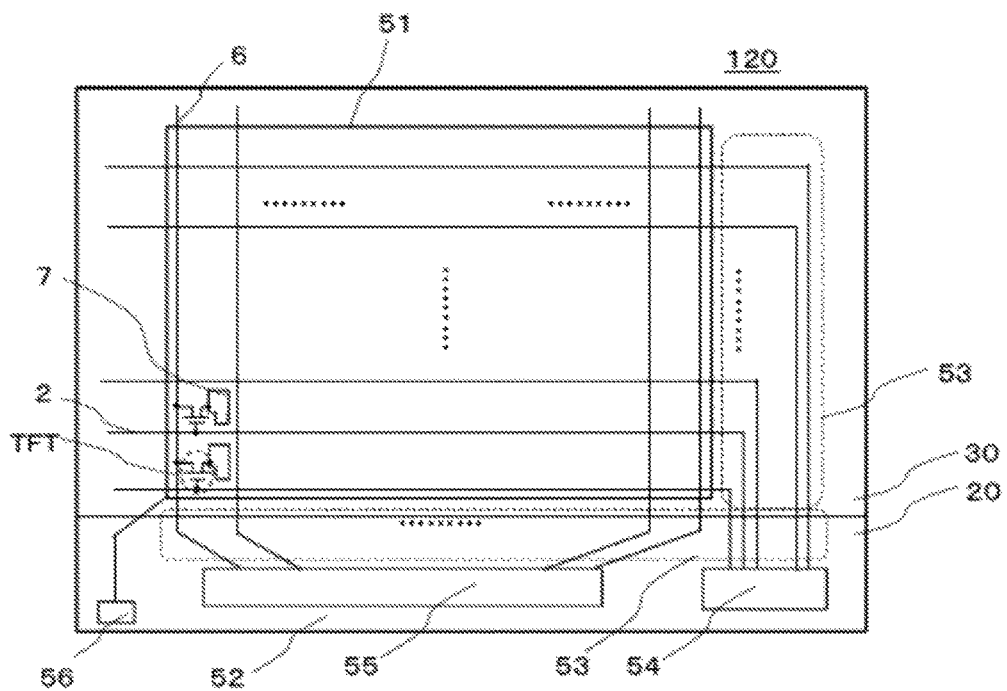
FIG. 1 is a plan view of a liquid crystal display panel according to a first preferred embodiment.

The preferred embodiments of the present invention will be described in detail below with reference to the accompanying drawings. It should be noted that the present invention is not limited to the following preferred embodiments. FIG. 1 is a plan view of a liquid crystal display panel according to the present invention.

A liquid crystal display panel 120 has a structure in which a counter substrate 30 is bonded onto an active matrix substrate 20 with a liquid crystal layer interposed therebetween in top view. The counter substrate 30 is smaller than the active matrix substrate 20, and hence has a region where the active matrix substrate 20 is exposed. A drive circuit and the like (to be described later) are generally formed in this region.

The active matrix substrate 20 will be described below. The active matrix substrate 20 is divided into a display region 51 corresponding to the display screen of the liquid crystal display panel and a frame region 52 which is a peripheral region of the display region 51. In the display region 51, a gate wiring 2 and a source wiring 6 intersect each other, and the region partitioned by both wirings corresponds to a pixel. It can also be said that the display region 51 is formed of an aggregate of pixels. A thin-film transistor (TFT) which is a switching element connected to both wirings is provided in each pixel, and each TFT is connected to a pixel electrode 7 in each pixel.

A lead wiring 53 connected to the gate wiring 2 or the source wiring 6 extends in the frame region 52 and is connected to a gate drive circuit 54 and a source drive circuit 55. In general, both drive circuits and the counter substrate 30 do not overlap as shown in FIG. 1.

The counter electrode (common electrode) is formed on the entire surface of the display region 51 and is kept at the common potential via an external terminal 56. As will be described later, the difference between the common potential remaining the same throughout the respective pixels and the signal voltage applied to the pixel electrode of each pixel is applied to the liquid crystal layer (not shown), thereby driving the liquid crystal molecules and performing display for each pixel.

Figure 2:
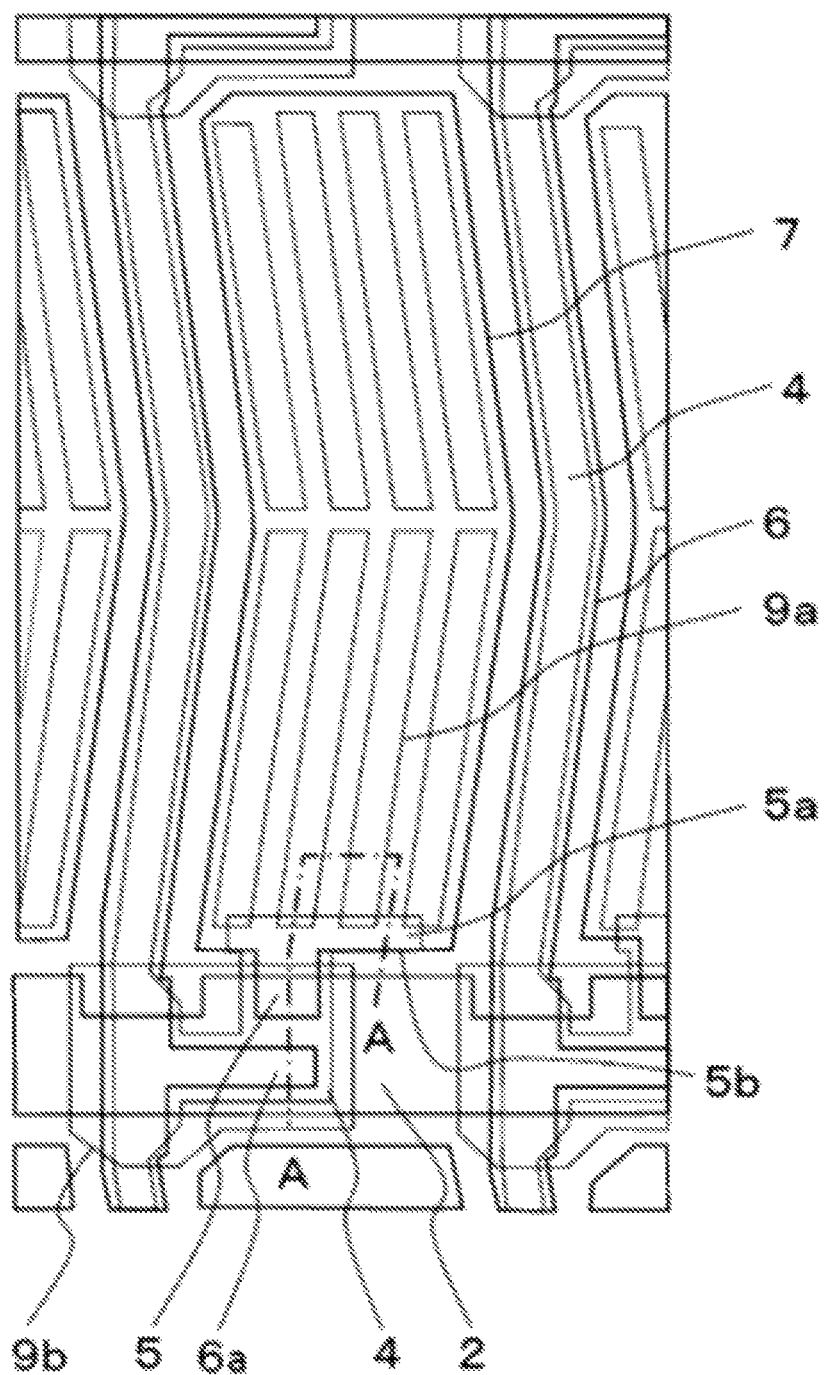
FIG. 2 is a plan view of a pixel of an active matrix substrate forming a liquid crystal display panel according to the first preferred embodiment.
Figure 3:
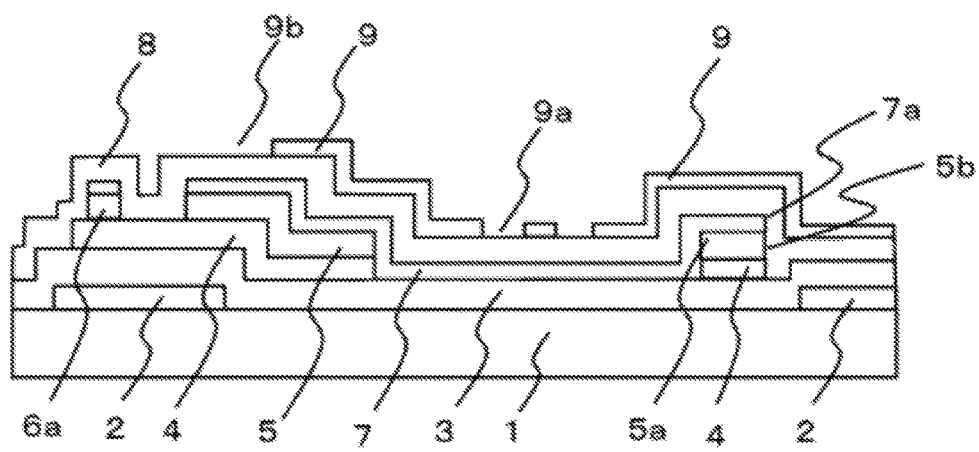
FIG. 3 is a sectional view taken along line A-A in FIG. 2.

A preferred embodiment of a liquid crystal display panel according to the present invention will be described with reference to FIGS. 2 and 3. FIG. 2 is a plan view of a pixel of an active matrix substrate forming a liquid crystal display panel according to the first preferred embodiment. FIG. 3 is a sectional view taken along line A-A in FIG. 2.

The basic structure of the active matrix substrate 20 and its manufacturing method will be described with reference to FIGS. 2 and 3. A structure related to the effect of the present invention will be described subsequently. A gate wiring 2 extending along the first direction is formed on a first transparent substrate 1 such as a glass substrate or a resin substrate. The gate wiring 2 is formed by patterning from a first metal film such as an Al, Mo, Ti, Cr, Ta, or Cu film having a thickness of about 100 nm to 500 nm. A gate insulating film 3 made of an insulating film such as a silicon oxide or silicon nitride layer is provided so as to cover the gate wiring 2.

A semiconductor layer 4 made of an oxide semiconductor material such as silicon or In—Ga—Zn—O is formed on the gate insulating film 3 to a thickness of about 100 nm to 300 nm so as to at least partly overlap the gate wiring 2. The source wiring 6 extending in the second direction so as to intersect the gate wiring 2 is formed on the upper layer of the gate insulating film 3. A region partitioned by a plurality of gate wirings 2 and a plurality of source wirings 6 corresponds to a pixel.

The source wiring 6 has a region extending on the semiconductor layer 4 as a source electrode 6a, A drain electrode 5 is formed on the semiconductor layer 4 so as to face the source electrode 6a, and a region where the source electrode 6a and the drain electrode 5 face each other is also called a channel region. A drain electrode extension portion (drain bar) 5a extends from the drain electrode 5, which is a region to be connected to a pixel electrode described later.

The source electrode 6a and the drain electrode 5 are formed by patterning from a second metal film that is a single layer or multilayer structure of a metal film or an alloy film made of Al, Mo, Ti, Cr, Ta, Cu, and the like and having a thickness of about 100 nm to 500 nm. Although not shown, when the semiconductor layer 4 is made of silicon, an ohmic layer in which an impurity such as phosphorus is added to silicon may be formed so as to be sandwiched between the semiconductor layer 4 and the drain electrode 5. In this case, it is necessary to remove the ohmic layer on the channel region, which is the region where the drain electrode 5 and the source electrode 6a face each other. The thin-film transistor TFT as a switching element is constituted by the above elements.

On the thin-film transistor TFT, the pixel electrode 7 is provided in each pixel so as to form a matrix pattern. FIG. 2 shows each pixel electrode 7 in a shape in which a rectangular pattern reflecting the pixel shape partially protrudes. Each pixel electrode 7 is formed of a first transparent conductive film having a thickness of about 50 nm to 150 nm and is formed so as to at least partially overlap the drain electrode 5 in top view. As the material of the transparent conductive film, indium-tin-oxide (ITO) or indium-zinc-oxide (IZO) may be used.

The drain electrode 5 and the drain electrode extension portion 5a are formed in only the region where both the pixel electrode 7 and the semiconductor layer 4 are present (this formation is related to the manufacturing method described later). In other words, the drain electrode 5 and the drain electrode extension portion 5a are formed so as to be sandwiched between the upper layer and the lower layer, i.e., the pixel electrode 7 and the semiconductor layer 4 in a region where the pixel electrode 7 and the semiconductor layer 4 overlap each other.

An interlayer insulating film 8 is for red so as to cover the thin-film transistor TFT and the pixel electrode 7. As the interlayer insulating film 8, an inorganic insulating film such as silicon oxide or silicon nitride may be used.

On the interlayer insulating film 8, a common electrode 9 is formed so as to overlap each pixel electrode 7 in top view. The common electrode 9 is made of a second transparent conductive film having a thickness of about 50 nm to 150 nm, and indium-tin-oxide (ITO) or indium-zinc-oxide (IZO) may be used as a material for the transparent conductive film. As described above, the common electrode 9 is formed on substantially the entire surface in the display region 51. In each pixel, a slit 9a and an opening 9b on the TFT are formed.

The slit 9a and the opening 9b are regions where the common electrode 9 is not formed. In these regions, the interlayer insulating film 8 which is the underlying layer is exposed. FIG. 2 shows a form in which the common electrode 9 spreads over the entire surface of a region other than the slit 9a and the opening 9b.

An alignment film (not shown) for aligning the liquid crystal molecules is further formed so as to cover the common electrode 9. Note that the alignment film is also formed on the side of the counter substrate 30 which is in contact with the liquid crystal layer.

The array structure shown in FIGS. 2 and 3 is one form of the fringe field switching (FFS) method. In the FFS method, the fringe electric field generated between each pixel electrode 7 and the common electrode 9 at the edge portion of the slit 9a drives the liquid crystal molecules of the liquid crystal layer to display each pixel. Therefore, in each pixel, visible light transmitted through the overlapping region of the pixel electrode 7 and the common electrode 9 contributes to display.

Next, a method of manufacturing the array structure shown in FIGS. 2 and 3 will be described. A first metal film is formed on the transparent substrate 1 by sputtering or the like and the gate wiring 2 and the lead wiring 53 between the gate wiring 2 and the gate drive circuit 54 are formed by patterning. Next, the gate insulating film 3 and the semiconductor layer 4 are continuously formed by plasma CVD. A second metal film 11 is then formed by sputtering or the like.

Figure 6:
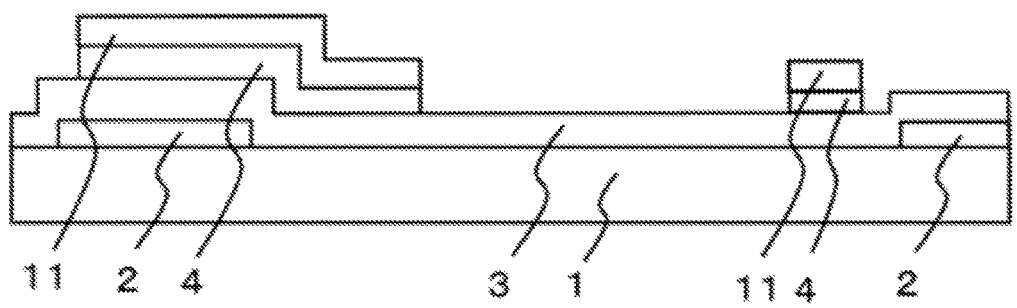
FIGS. 6 to 8 are sectional views each showing a pixel of the active matrix substrate.

FIG. 6 shows a sectional structure after patterning of the semiconductor layer 4 and the second metal film 11 after the photolithography step. Referring to FIG. 6, the semiconductor layer 4 is formed in a desired pattern, but the source electrode 6a and the drain electrode 5 of the second metal film 11 are not isolated from each other yet.

Figure 7:
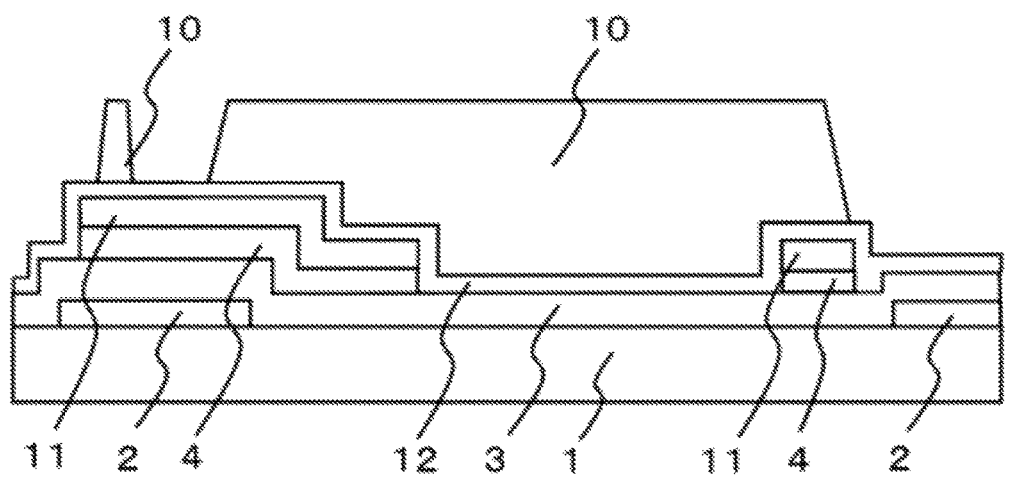

Next, FIG. 7 shows a sectional structure when a first transparent conductive film 12 is formed using sputtering or the like, and a resist 10 is formed by patterning through a photolithography step. The formation region of the resist 10 covering the first transparent conductive film 12 corresponds to the formation region of the source wiring 6, the source electrode 6a, the drain electrode 5, the drain electrode extension portion 5a, the pixel electrode 7, and the like in the display region.

In particular, in the region where the drain electrode extension portion 5a is formed, there is a multilayer pattern of the semiconductor layer 4 and the second metal film 11. In the first preferred embodiment, however, after etching (described later), the resist 10 is formed such that the side surface of an end portion of the multilayer pattern substantially coincides with the side surface of an end portion of the first transparent conductive film 12 in top view.

Subsequently, the first transparent conductive film 12 exposed from the resist 10 is removed by etching to form the pixel electrode 7. Further, the exposed second metal film 11 is removed by etching to pattern the source electrode 6a, the drain electrode 5, and the drain electrode extension portion 5a.

In this case, in the drain electrode extension portion 5a, the semiconductor layer 4, the second metal film 11, and the side surface of an end portion of the first transparent conductive film 12 coincide with each other. Using such a manufacturing method can implement patterning of three layers including the semiconductor layer 4, the second metal film 11, and the first transparent conductive film 12 by two photolithography steps.

Thereafter, the interlayer insulating film 8 is formed by plasma CVD, and required contact holes are opened. Subsequently, a second transparent conductive film is formed, and the common electrode 9 is formed by patterning through a photolithography step.

A structure related to the effect of the present invention will be described next. In the structure of the present invention, the side of the drain electrode extension portion 5a, which is farthest away from the center of the pixel electrode 7, in other words, an end side 5b of the drain electrode extension portion which is closest to the gate wiring 2, substantially coincides with an end side 7a of the pixel electrode 7, which is closest to the gate wiring 2 in top view. Conventionally, the end side 7a of the pixel electrode 7 is disposed closer to the gate wiring 2 than the end side 5b of the drain electrode extension portion. Accordingly, the drain electrode extension portion 5a is disposed in the direction of the central portion of the pixel. However, with the arrangement according to the present invention, the drain electrode extension portion 5a can be brought closer to the gate wiring 2 than in the prior art, so that the region through which the visible light can pass in the pixel electrode 7 can be increased.

Second Preferred Embodiment

Figure 4:
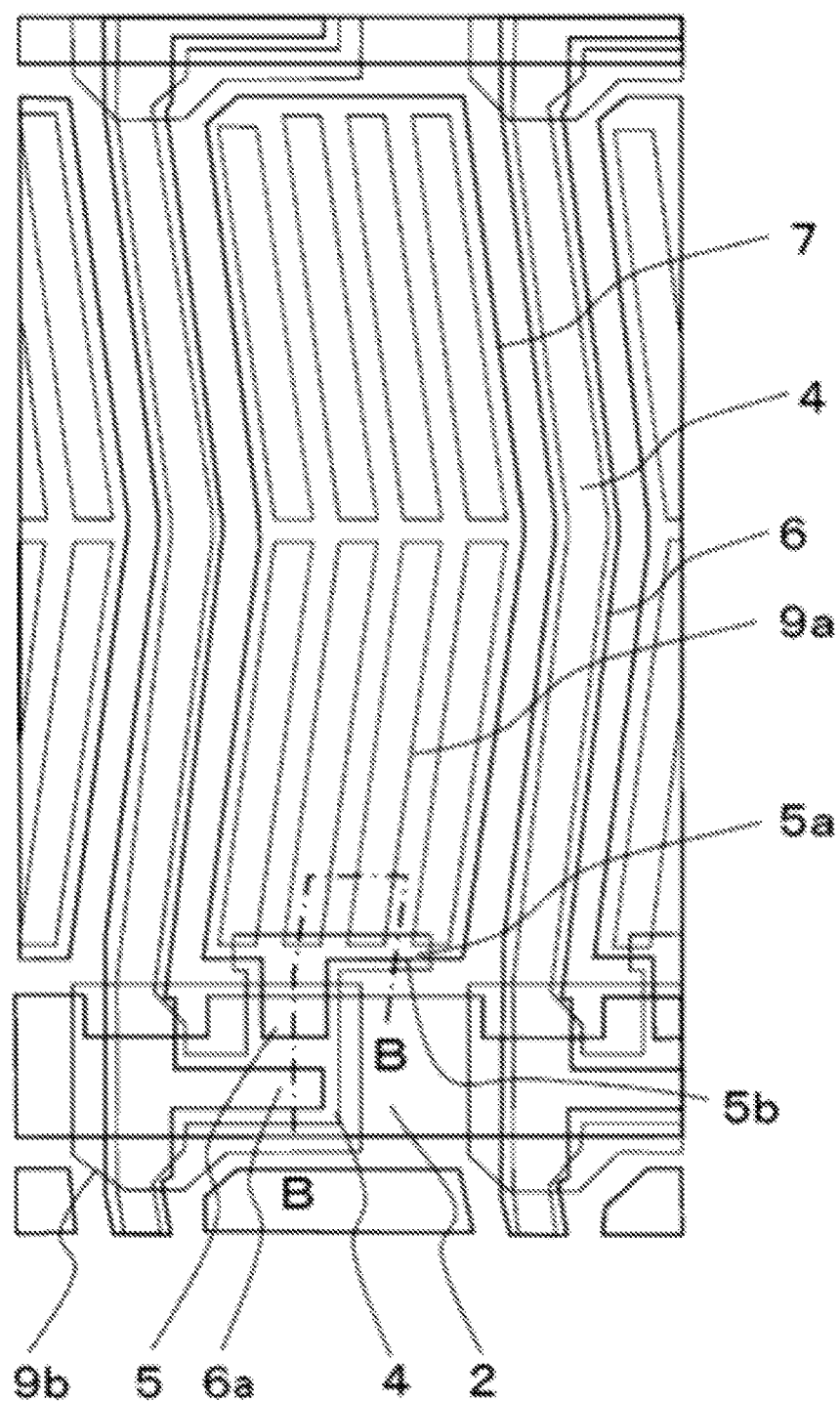
FIG. 4 is a plan view of a pixel of an active matrix substrate forming a liquid crystal display panel according to a second preferred embodiment.
Figure 5:
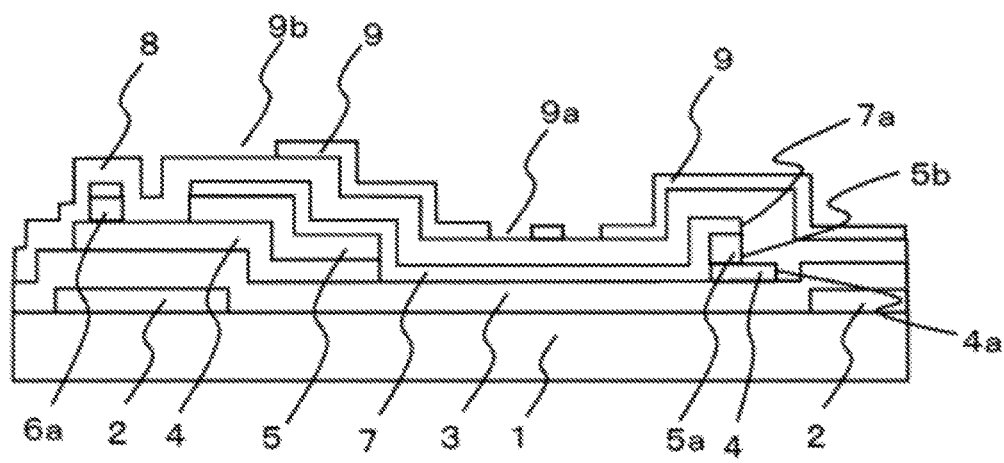
FIG. 5 is a sectional view taken along line B-B in FIG. 4.

A preferred embodiment of a liquid crystal display panel according to the present invention will be described with reference to FIGS. 4 and 5. FIG. 4 is a plan view of a pixel of an active matrix substrate forming the liquid crystal display panel according to the second preferred embodiment. FIG. 5 is a sectional view taken along line B-B in FIG. 4.

In the second preferred embodiment, because the difference from the first preferred embodiment is only a drain electrode extension portion 5a, the drain electrode extension portion 5a will be described. Referring to FIGS. 4 and 5, the side surfaces of the end side 5b of the drain electrode extension portion and the end side 7a of the pixel electrode 7 substantially coincide with each other as in the first preferred embodiment. The difference is that the lower semiconductor layer 4 protrudes from the drain electrode extension portion 5a toward the gate wiring 2.

In the first preferred embodiment, because the drain electrode extension portion 5a having a low electric resistance approaches the gate wiring 2, the capacitance between the drain electrode extension portion 5a and the gate wiring 2 increases, which may affect the signal transmission. However, because the region closest to the gate wiring in the second preferred embodiment is the semiconductor layer 4 with high resistance, it is possible to suppress an increase in parasitic capacitance. Accordingly, compared to the first preferred embodiment, the drain electrode extension portion can be brought closer to the gate wiring 2.

A manufacturing method for the structure according to the second preferred embodiment shown in FIGS. 4 and 5 will be described next. The manufacturing steps described with reference to FIGS. 1 to 6 in the first preferred embodiment are the same as in the second preferred embodiment, so the subsequent manufacturing steps will be described. As described above, referring to FIG. 6, the semiconductor layer 4 is formed in a desired pattern, but the source electrode 6a and the drain electrode 5 of a second metal film 11 are not isolated from each other yet.

Figure 8:
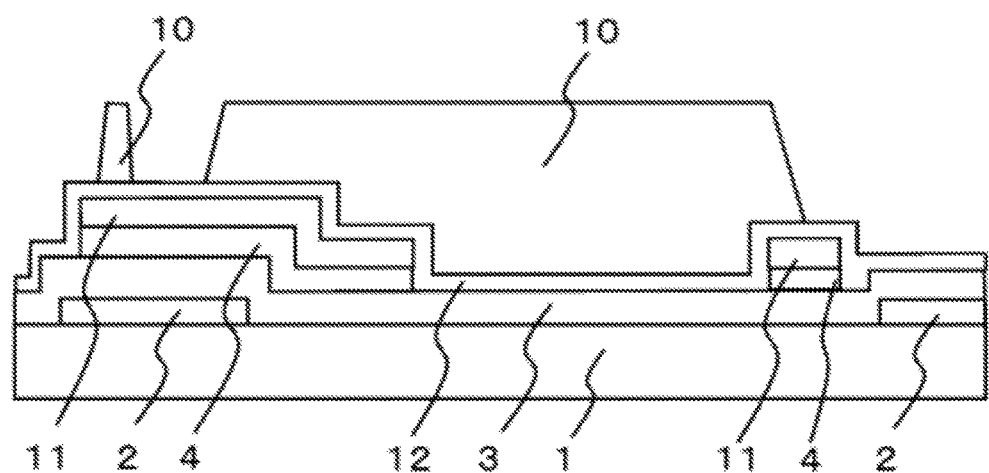

In the first preferred embodiment, in the photolithography step after the formation of the structure shown in FIG. 6, the structure is shifted to the structure shown in FIG. 7. In contrast to this, in the second preferred embodiment, the structure is shifted to the structure shown in FIG. 8. The difference between FIG. 7 and FIG. 8 is the formation region of the resist 10 covering a first transparent conductive film 12. A multilayer pattern of the second metal film 11 and the semiconductor layer 4 is formed in the region where the drain electrode extension portion 5a is formed. The resist 10 in the second preferred embodiment does not completely cover this multilayer pattern. For this reason, after the subsequent etching of the first transparent conductive film 12 and the second metal film 11, the end side of the semiconductor layer 4 and the end side 5b of the drain electrode extension portion do not coincide in top view. As a result, as shown in FIG. 4, the semiconductor layer 4 protrudes in top view.

In the first preferred embodiment, the drain electrode extension portion is closer to the gate wiring 2 than in the prior art. Accordingly, depending on the accuracy of pattern arrangement, the drain electrode extension portion becomes too close to the gate wiring 2, and the parasitic capacitance between the drain electrode extension portion and the gate wiring 2 increases, resulting in a delay in signal transmission. However, because the region closest to the gate wiring in the second preferred embodiment is the semiconductor layer 4 with high resistance, it is possible to suppress an increase in parasitic capacitance. Accordingly, compared to the first preferred embodiment, the drain electrode extension portion can be brought closer to the gate wiring 2.

Third Preferred Embodiment

Figure 9:
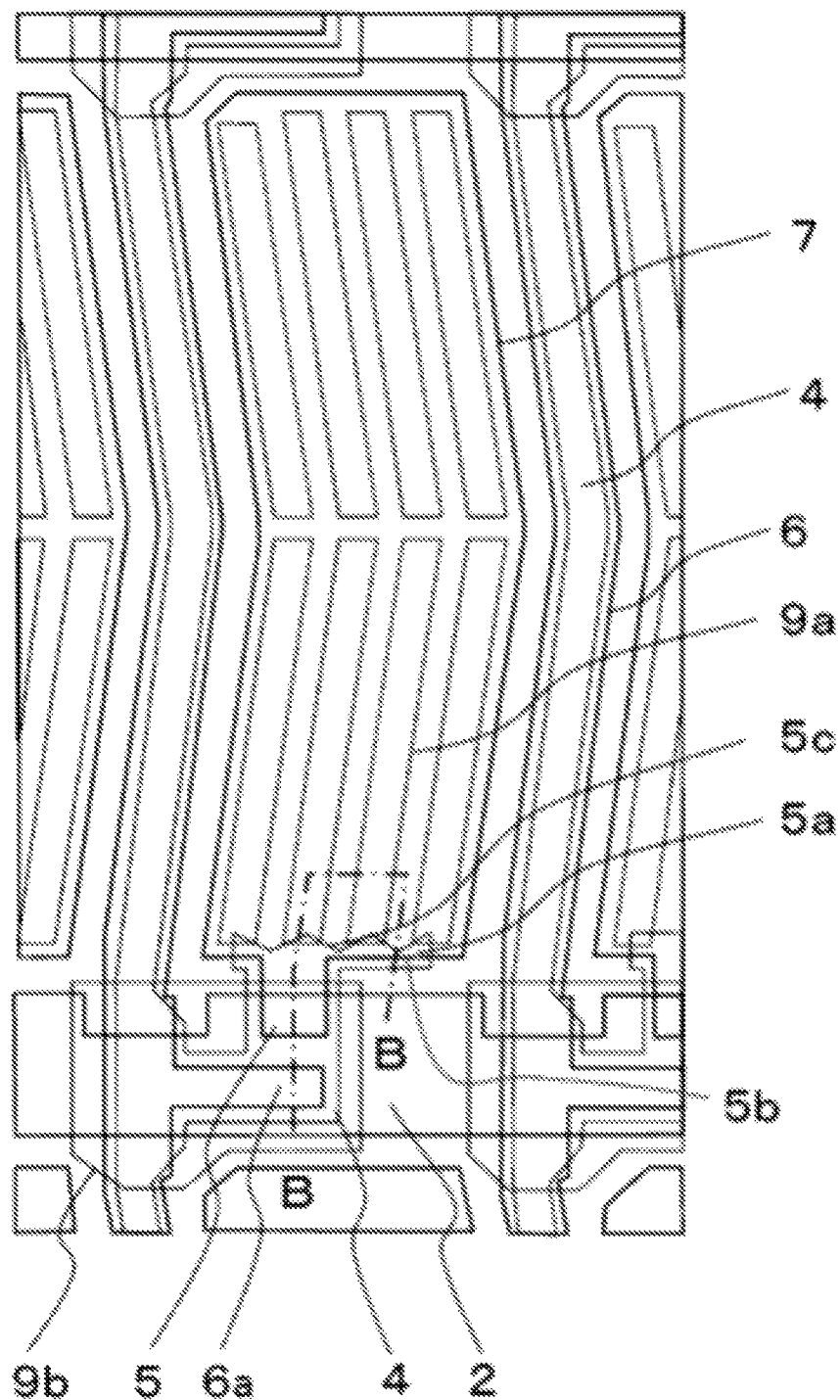
FIG. 9 is a plan view of a pixel of an active matrix substrate forming a liquid crystal display panel according to a third preferred embodiment.

A preferred embodiment of a liquid crystal display panel according to the present invention will be described with reference to FIG. 9. FIG. 9 is a plan view of a pixel of an active matrix substrate forming the liquid crystal display panel according to the third preferred embodiment. An end side 5c of a drain electrode extension portion 5a shown in FIG. 9, which is located on the side covered with the pixel electrode 7 is processed not to be a straight line but to be a zigzag-shaped uneven pattern. Although FIG. 9 shows a form that is formed into a zigzag pattern, the present invention is not limited to this as long as it has an uneven shape and may include a curve.

By adopting such a shape, the distance over which the pixel electrode 7 covers the drain electrode extension portion 5a increases to improve the coverage, so that the electrical connection resistance between the pixel electrode 7 and the drain electrode 5 is reduced. Thus, the effect of improving the transmission of the signal potential to the pixel electrode 7 can be obtained. Note that the shape shown in FIG. 9 can also be applied to the structure of the first preferred embodiment.

Note that each preferred embodiment of the present invention has exemplified the FFS type active matrix substrate. However, the present invention is not limited to this form. The present invention can also be applied to a liquid crystal display panel using a so-called TN type active matrix substrate in which a common electrode is formed on the counter substrate 30. The present invention can also be applied to a top gate type thin-film transistor. In addition, multicolor filters such as RGB and RGBW filters are usually formed on the counter substrate 30, but color filters may be formed on the active matrix substrate.

Each of the liquid crystal display panels described in the first to third preferred embodiments is formed into a liquid crystal module by having polarizing plates bonded to the two surfaces of the liquid crystal display panel, provided with a drive circuit, and combined with a backlight having a light source such as an LED or a reflecting sheet. This module is further incorporated in a housing module and connection is made to form a liquid crystal display device.

While the invention has been shown and described in detail, the foregoing description is in all aspects illustrative and not restrictive. It is therefore understood that numerous modifications and variations can be devised without departing from the scope of the invention.

What is claimed is:

1. An array substrate comprising:
   on a substrate,
   a gate wiring;
   a source wiring orthogonal to the gate wiring via an insulating film;
   a source electrode connected to the source wiring;
   a semiconductor layer formed as a lower layer of the source electrode;
   a drain electrode facing the source electrode on the semiconductor layer and having an extension portion; and
   a pixel electrode directly stacked on the extension portion of the drain electrode,
   wherein an end side of the extension portion of the drain electrode coincides with an end side of the pixel electrode.

2. The array substrate according to claim 1, wherein the semiconductor layer protrudes outside from the end side of the extension portion of the drain electrode which is not covered with the pixel electrode.

3. The array substrate according to claim 1,
   wherein an other end side of the extension portion of the drain electrode which is covered with the pixel electrode has a zigzag shape or an uneven shape.

4. The array substrate according to claim 1, further comprising:
   an interlayer insulating film covering the source wiring and the pixel electrode; and
   a common electrode formed on the interlayer insulating film so as to overlap the pixel electrode.

5. A liquid crystal display device comprising the array substrate according to claim 1.

6. The array substrate according to claim 2,
   wherein an other end side of the extension portion of the drain electrode which is covered with the pixel electrode has a zigzag shape or an uneven shape.

7. The array substrate according to claim 2, further comprising:
   an interlayer insulating film covering the source wiring and the pixel electrode; and
   a common electrode formed on the interlayer insulating film so as to overlap the pixel electrode.

8. The array substrate according to claim 3, further comprising:
   an interlayer insulating film covering the source wiring and the pixel electrode; and
   a common electrode formed on the interlayer insulating film so as to overlap the pixel electrode.

9. A liquid crystal display device comprising the array substrate according to claim 2.

10. A liquid crystal display device comprising the array substrate according to claim 3.

11. A liquid crystal display device comprising the array substrate according to claim 4.

* * * * *